(12) United States Patent
Sato

(10) Patent No.: US 9,326,409 B2
(45) Date of Patent: Apr. 26, 2016

(54) ELECTRIC COMPONENT

(71) Applicant: Takato Sato, Toyota (JP)

(72) Inventor: Takato Sato, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 10 days.

(21) Appl. No.: 14/398,793

(22) PCT Filed: Sep. 26, 2012

(86) PCT No.: PCT/JP2012/074767
§ 371 (c)(1),
(2) Date: Nov. 4, 2014

(87) PCT Pub. No.: WO2014/049740
PCT Pub. Date: Apr. 3, 2014

(65) Prior Publication Data
US 2015/0116949 A1 Apr. 30, 2015

(51) Int. Cl.
H01L 23/48 (2006.01)
H05K 7/02 (2006.01)
B60K 6/00 (2007.10)
B60W 10/00 (2006.01)

(52) U.S. Cl.
CPC .. *H05K 7/02* (2013.01); *B60K 6/00* (2013.01); *B60W 10/00* (2013.01); *H01L 23/48* (2013.01); *B60L 2210/10* (2013.01); *H01L 2924/0002* (2013.01); *Y02T 10/7216* (2013.01)

(58) Field of Classification Search
CPC ........ H05K 7/02; H01L 23/48; H01L 23/482; H01L 23/4822; H01L 23/4821; B60K 6/00; B60W 10/00
See application file for complete search history.

(56) References Cited

U.S. PATENT DOCUMENTS

| 2003/0094101 A1* | 5/2003 | Hara | B29C 66/71 96/4 |
| 2014/0159054 A1* | 6/2014 | Otake | H01L 24/36 257/77 |
| 2015/0111063 A1* | 4/2015 | Khan | C23C 14/08 428/632 |

FOREIGN PATENT DOCUMENTS

JP 2008-177292 A 7/2008
JP 2012-089548 A 5/2012

OTHER PUBLICATIONS

International Search Report issued Dec. 25, 2012 in PCT/JP2012/074767 filed Sep. 26, 2012.

* cited by examiner

*Primary Examiner* — Hoa C Nguyen
*Assistant Examiner* — Keith Depew
(74) *Attorney, Agent, or Firm* — Oblon, McClelland, Maier & Neustadt, L.L.P.

(57) ABSTRACT

The electric component includes first and second members 30 and 40, at least one of which being used as an electric conductor. The first member includes a bus bar 31 and a resin member 32 for covering the bar and has a predetermined area where they expose to the exterior. The second member has an exposing portion where the surface of the aluminum wire 44 exposes and the exposing portion faces portions (H1, H3) where the bar 31 exposes to the exterior at the predetermined area. The first and second members are supported by a housing 10 including a resin at least having a part exposing to the exterior. In this electric component, the first member is configured such that the contact angle of the water droplet relative to the surface of the resin member 32 within the predetermined area is smaller than or equal to 70 degrees.

4 Claims, 3 Drawing Sheets

ELECTRIC COMPONENT

TECHNICAL FIELD

The invention relates to an electric component which includes a metal member and a cover member covering the metal member and uses the metal member as an electric inductor.

BACKGROUND ART

Conventionally, a power module which is called IPM (Intelligent Power Module), is known. The IPM is, for example, an electric part used for converting a direct electrical power of a battery mounted on a hybrid vehicle, an electric vehicle or the like to "an alternating electrical power for driving an electric motor".

Recently, the electric part such as the IPM has been downsized and thus, it is desired that more elements, wires (including a bus bar which is the metal member) and the like can be mounted in one housing. To this end, a structure has been proposed in which the bus bars are positioned at various heights and thereby, are positioned in a multistage manner (sterically) (for example, see Patent Literature 1).

On the other hand, in this electric component, it is necessary to ensure an insulation between the metal members. To this end, in general, the metal member is covered by an insulating resin.

CITATION LIST

Patent Literature

Patent Literature 1: JP Unexamined Patent Publication No. 2012-89548

SUMMARY OF INVENTION

As a method for covering the metal member such as the bus bar by the insulating resin, an insert molding method for carrying out a resin molding by positioning a metal member in a mold and thereafter, inserting a melting resin into the mold, is known. However, in this insert molding method, the resin molding is carried out under the state that a positioning pin for positioning the metal member relative to the mold and/or a pressing pin for preventing the metal member from moving during the resin insertion abut against the metal member. As a result, a surface portion of the metal member, which "the positioning pin and/or the pressing pin" abut, is not covered by the resin and the metal is exposing to the exterior even after the molding. In addition, even when a molding method other than the insert molding method is used, a portion of the metal member may not be completely covered by the resin and may being exposing to the exterior.

As a result, in the aforementioned electric component, a distance between the surface portions of the metal members exposing to the exterior (hereinafter, this distance will be referred to as—distance between the metal exposing portions—) may not be sufficient. In particular, when the electric component is downsized, the distance between the metal exposing portions is short.

On the other hand, such an electric component is, for example, used under the high humidity. Therefore, as shown in FIG. 6, a water droplet 61 occurring due to a dew condensation may adhere to a surface of the resin member 63. When the water droplet 61 becomes large, the water droplet 61 may reach both of "a metal member 62 exposing through an opening of resin member 63" and "another metal member 64" and as a result, a short may occur between the metal member 62 and the other metal member 64 and thereby, the electric component may not accomplish a desired function.

The present invention is to solve the aforementioned problem and one object of the present invention is to provide the electric component which can reduce a possibility that the short occurs between the metal members by the water droplet occurring due to the dew condensation even when the distance between the metal exposing portions is short or to provide the electric component which can avoid the increasing of the possibility that the short occurs between the metal members by the water droplet even when the distance between the metal exposing portions is short.

The electric component comprises:

a first member which includes a first metal member and a cover member for covering the first metal member and is configured to have a predetermined area where only "the first metal member and the cover member" expose to the exterior; and a second member which includes a second metal member and is configured to have an exposing portion where a surface of the second metal member exposes, and wherein a portion where the first metal member exposes to the exterior at the predetermined area and the exposing portion of the second metal member face each other and at least one of the first and second metal members is used as an electric conductor.

Further, the cover member is configured such that a contact angle of the water droplet at a surface within the predetermined area is smaller than or equal to 70 degrees.

The contact angle of the water droplet is an angle between "a tangent line at a boundary between the water droplet dropped on a surface of a material (a surface of a planner portion of a member formed of a predetermined material) and the material" and "a surface of the material" (the degrees θ1 and θ2 in FIG. 4). It can be said that as this angle becomes small, "an affinity for the water becomes large".

In general, in the conventional electric component, a material having a relatively small affinity for the water is used as the cover member for covering the first metal member. The contact angle of the water droplet at a surface of the cover member in the conventional electric component is larger than 70 degrees.

On the other hand, the electric component of the present invention defined by the claim 1 is configured such that the contact angle of the water droplet relative to the surface of the cover member (the surface within the predetermined area) is smaller than or equal to 70 degrees. Thereby, even when the water droplet occurring due to the dew condensation exists on the surface of the cover member, the contact angle of the water droplet relative to the surface of the cover member (the surface within the predetermined area) is smaller than that of the conventional electric component. That is, even when the water droplet having the same amount of the water as that in the conventional electric component exists on the cover member surface, the height of the water droplet is lower than that in the conventional electric component. Thereby, the possibility that the water droplet reaches both of the surfaces of the first and second metal members, can be decreased and as a result, the possibility that the short occurs between the metal members can be decreased (refer to FIG. 5).

Further, it is desired that the cover member is processed to have a surface roughness such that the contact angle of the water droplet relative to the surface within the predetermined area is smaller than or equal to 70 degrees.

By increasing the surface roughness of the surface within the predetermined area of the cover member, the surface area of the cover member within the predetermined area increases and thereby, the contact angle of the water droplet relative to the surface of the cover member can be decreased. The surface roughness of the cover member can be easily increased by the process treatment such as the well-known "blasting and plasma etching". Therefore, according to the aforementioned configuration, the electric component having the small possibility that the short occurs between the metal members due to the water droplet, can be easily obtained.

Another electric component according to the present invention comprises:

a first member which includes a first metal member and a cover member for covering the first metal member and is configured to have a predetermined area where only "the first metal member and the cover member" expose to the exterior; and a second member which includes a second metal member and is configured to have an exposing portion where a surface of the second metal member exposes, and wherein a portion where the first metal member exposes to the exterior at the predetermined area and the exposing portion of the second metal member face each other and at least one of the first and second metal members is used as an electric conductor.

Further, the cover member is processed for decreasing the contact angle of the water droplet relative to the surface within the predetermined area.

The process for decreasing the contact angle of the water droplet may include a process for decreasing the contact angle relative to the surface of the cover member of the first member, which process being one of "a process treatment, a surface modification treatment, a surface washing treatment, a surface coating treatment and the like" relative to the cover member. By applying the process for decreasing the contact angle of the water droplet, the contact angle of the water droplet relative to "the surface of the cover member of the first member exposing to the exterior within the predetermined area" can be decreased to a lower level than the contact angle before the treatment is applied and thus, the height of the water droplet can be decreased. Thereby, the possibility that the short occurs between the metal members, can be easily decreased.

Further another electric component according to the present invention comprises:

a first member which includes a first metal member and a cover member for covering the first metal member and is configured to have a predetermined area where only "the first metal member and the cover member" expose to the exterior;

a second member which includes a second metal member and is configured to have an exposing portion where a surface of the second metal member exposes; and a housing which supports the first member and includes an insulating member and is configured such that a part of or an entirety of a surface of the insulating member exposes to the exterior, and wherein a portion where the first metal member exposes to the exterior at the predetermined area and the exposing portion of the second metal member face each other and at least one of the first and second metal members is used as an electric conductor, and wherein the cover member is configured such that the contact angle of the water droplet relative to a surface within the predetermined area is smaller than that relative to a surface of the insulating member which exposes to the exterior.

According to the aforementioned configuration, the contact angle of the water droplet relative to the surface within the predetermined area of the cover member of the first member is smaller than that relative to the surface of the insulating member of the housing which exposes to the exterior. In general, the process for decreasing the contact angle of the water droplet may lead to the complication of the process and/or the increasing of the cost. On the other hand, in the aforementioned configuration, the process for decreasing the contact angle of the water droplet is applied only to the cover member and thus, it is not necessary to apply the process for decreasing the contact angle of the water droplet to the insulation member and the like of the housing and as a result, the complication of the process and/or the increasing of the cost can be avoided. Further, according to the aforementioned configuration, even when the process for increasing the contact angle of the water droplet is applied to a member other than the cover member of the first member configuring the electric component for preventing the water droplet from entering, the application of the process for increasing the contact angle of the water droplet to the surface of the cover member of the first member (at least the surface of the cover member within the predetermined area) can be omitted. It should be noted that the contact angle of the water droplet relative to "the entire surface of the cover member exposing to the exterior" may be smaller than that relative to the surface of the insulating member exposing to the exterior.

MODE FOR CARRYING OUT INVENTION

Below, a "power module as the electric component (hereinafter, referred to as—present power module—)" according to an embodiment of the present invention will be described with reference to the drawings.

Figure 1:
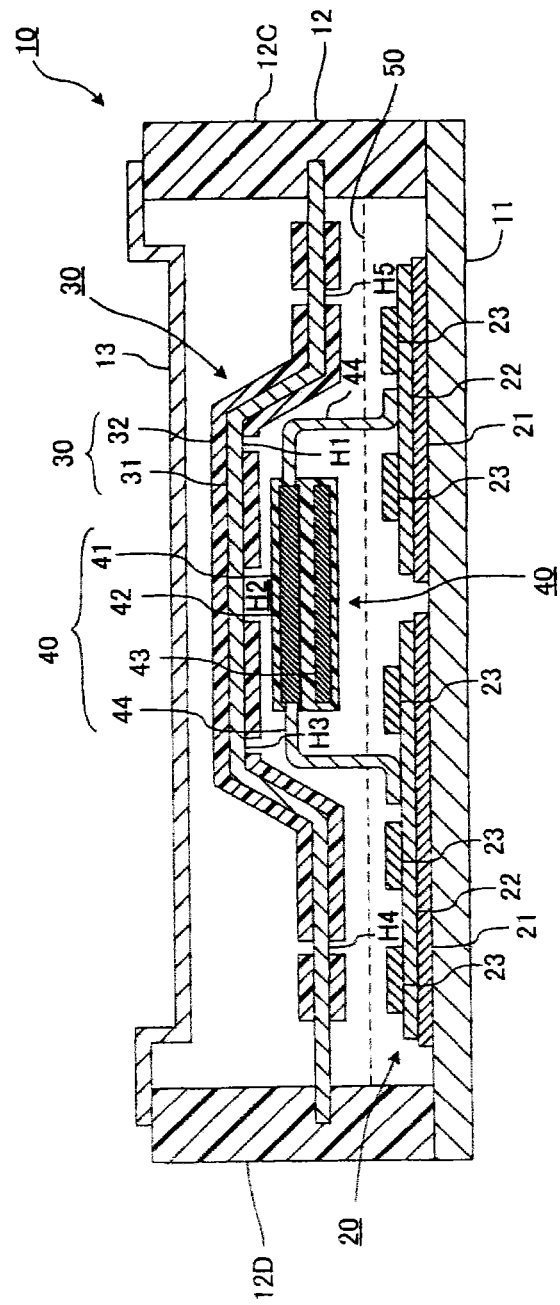
FIG. 1 shows a sectional view of a power module according to an embodiment of the present invention.
Figure 2:
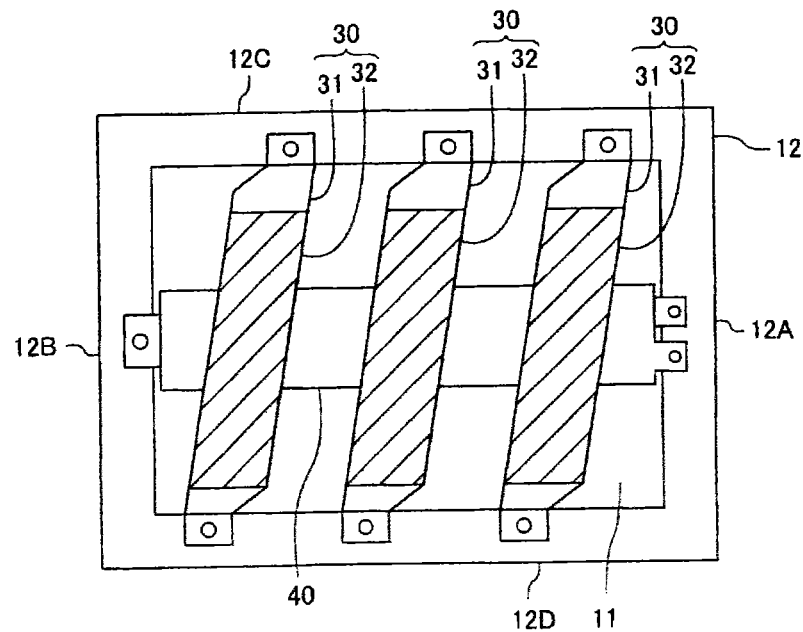
FIG. 2 shows a top view of the power module shown in FIG. 1 in which a part of parts thereof is omitted.
Figure 3:
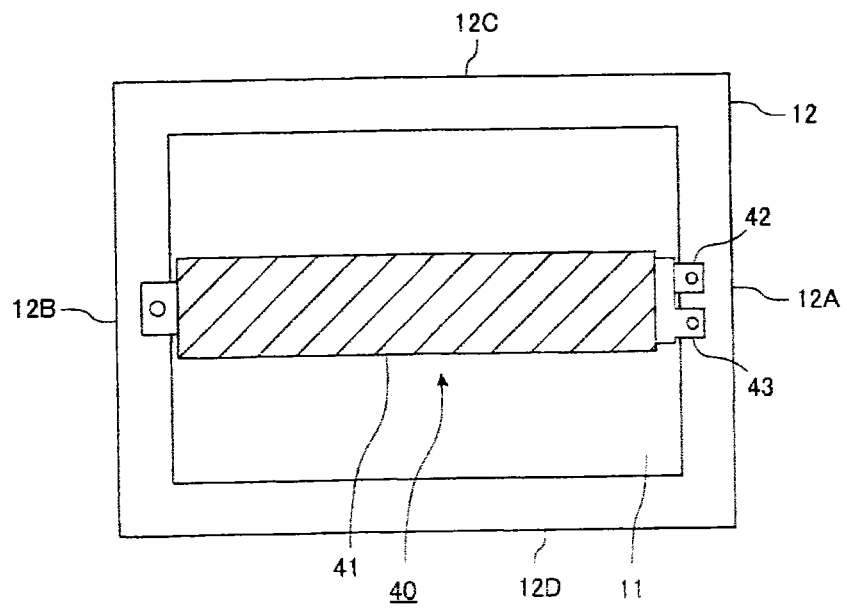
FIG. 3 shows a top view of the power module shown in FIG. 2 in which further parts are omitted.

The present power module is configured to convert a direct current of a vehicle battery to "a three-phase alternating current power for driving an electric motor" by a switching of a power semiconductor. As shown in FIGS. 1 to 3, the present power module has a housing 10, a semiconductor circuit part 20, three first members 30 and a second member 40.

The housing 10 has a radiation plate 11, a housing component 12 and a shield plate 13. The radiation plate 11 is made of a metal. The radiation plate 11 is a thin plate body having a rectangular plane shape. The radiation plate 11 has a function for radiating a heat generated at the driving of the present power module to the outside of the present power module.

Figure 4:
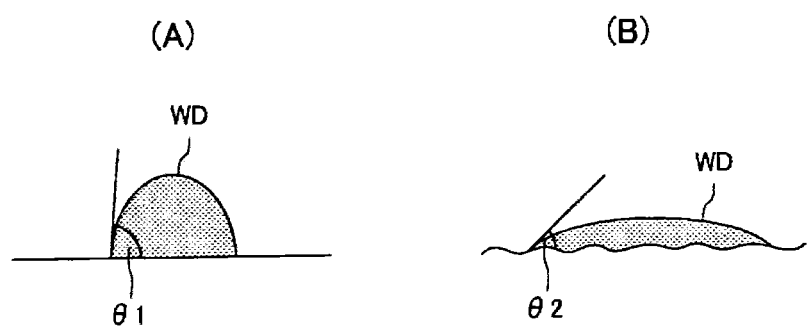
FIG. 4(A) shows a schematic diagram showing a relationship between the water droplet at a resin surface having a small surface roughness and the contact angle relative to the surface and FIG. 4(B) shows a schematic diagram showing a relationship between the water droplet at the resin surface having a large surface roughness and the contact angle relative to the surface.
Figure 5:
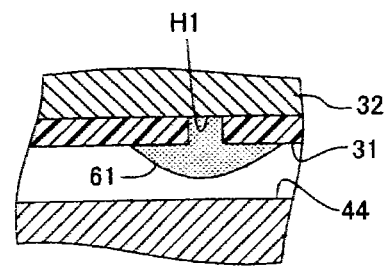
FIG. 5 shows a partially enlarged sectional view of the power module shown in FIG. 1.

The housing component 12 is made of a "resin having an insulating and heat resistance properties" which is called PPS (polyphenylenesulfide). The housing component 12 includes "four side wall portions (12A to 12D) which are four plates" each having a generally rectangular parallelepiped shape. These four side wall portions 12A to 12D extend upwards from an outer periphery portion of the radiation plate. That is, the four side wall portions 12A to 12D are provided to abut against portions each adjacent to each side of one of main faces of the radiation plate 11. The side wall portions adjacent to each other of the four side wall portions 12A to 12D are connected to each other. That is, as shown in FIG. 2, the side wall portion 12A is connected to the side wall portions 12C and 12D adjacent to the side wall portion 12A. The side wall portion 12B opposite to the side wall portion 12A is connected to the side wall portions 12C and 12D adjacent to the side wall portion 12B. Therefore, the side wall portions 12C and 12D face each other. As shown in FIG. 4(A), a contact angle θ of a water droplet WD relative to a surface of the housing component 12 is a relatively large angle θ1 (between 70 degrees and 90 degrees). It should be noted that the contact angle θ of the water droplet WD is an angle between "a tangent line of the water droplet surface at a boundary between the water droplet dropped on a surface of a material and the material" and "the surface of the material".

The shield plate 13 is made of an aluminum. The shield plate 13 is a thin plate body having the generally same planar shape as "the planar shape of the radiation plate 11". The shield plate 13 is secured to a top portion of the housing component 12 such that the shield plate 13 faces the radiation plate 11 across the housing component 12. The shield plate 13 has a function for shielding a radio noise radiating due to the switching of a power module semiconductor 23 described later.

As a result, the housing 10 forms a "sealed space" therein.

The semiconductor circuit part 20 includes a plurality of insulating substrates 21, a plurality of wiring part 22 and a plurality of power semiconductors 23.

The insulating substrates 21 are positioned on the main face at the upper side (the sealed space side) of the radiation plate 11 and are secured to the radiation plate 11 by a solder or the like. The insulating substrates 21 are insulating thin plates, respectively. Each of the insulating substrates 21 is used for electrically insulating the radiation plate 11 from "the wiring parts 22 and the power semiconductors 23".

The wiring parts 22 are aluminum thin films formed on the main face on the upper side of the insulating substrates 21, respectively. Each of the wiring parts 22 has a predetermined pattern and connects the power semiconductors 23 to each other. The wiring parts 22 are used for electrically connecting the power semiconductors 23 and a plurality of bus bars 31 described later to each other.

The power semiconductors 23 are secured to the upper main face of "the wiring parts 22 and the insulating substrates 21" by the solder or the like. Each of the power semiconductors 23 is an element which includes IGBT (Insulated Gate Bipolar Transistor) and a diode. The power semiconductors 23 are electrically connected to the wiring parts 22 via aluminum wires not shown. Each of the power semiconductors 23 is configured to carry out the switching on the basis of a control signal from a control circuit not shown, convert the direct current input via an input bus bar described later to a three-phase alternating current power and output the three-phase alternating current power obtained by the conversion via an output bus bar described later.

Each of the first members 30 (the output bus bar parts) includes a bus bar 31 and a resin member 32. The bus bar 31 is a thin plate made of a copper (a metal having an electric conductivity). For convenience, the bus bar 31 is also referred to as—first metal member—. The resin member 32 is made of PPS (that is, a resin having the insulating and heat resistance properties) similar to the housing component 12. As described later, the resin member 32 covers a substantial portion of the bus bar 31 for ensuring the insulating property of the bus bar 31. In addition, the surface of the resin member 32 is processed such that an unevenness is formed on this surface by a blasting (or a process treatment such as a plasma etching (a surface process treatment)). In other words, a surface roughness of the surface of the resin member 32 is larger than that of the surface of the housing component 12 which is made of the same material as that of the resin member 32 (PPS), however, is not processed by any surface process treatment.

As shown in FIG. 2, the shape of the bus bar 31 in the planar view is a generally parallelogram (a band shape). Therefore, the shape of the first member 30 in the planar view is also a generally parallelogram. Each of the three first members 30 is supported on the side wall portion 12C at its one end and is supported on the side wall portion 12D at its other end such that a distance between the first members 30 adjacent to each other and parallel to each other is maintained at a constant distance. In other words, the housing component 12 supports and secures the first members 30. It should be noted that FIG. 2 is a top view (a planar view) of the present power module under the state that the shield plate 13 is omitted. In FIG. 2, for convenience of the description, only "the parts configuring the radiation plate 11, the housing component 12, the first members 30 and the second member 40" are shown and no part other than these parts are not shown. Further, as can be understood from FIG. 1, each of the first members 30 configures a bridge for connecting the side wall portions 12C and 12D to each other so as not to contact the other parts in the space of the housing 10.

The bus bar 31 of the thus configured first member 30 is secured to the side wall portion 12D by a bolt and a nut not shown at its one end in the side wall portion 12D and is connected to an output terminal not shown. Further, the bus bar 31 is connected to the power semiconductors 23 via the bolt and the nut, the wirings not shown and the wiring parts 22 and is supplied with the three-phase alternating power obtained by the conversion by the power semiconductors 23 via the bolt and nut, the wirings and the wiring parts. In addition, the bus bar 31 is secured to the side wall portion 12C by a bolt and a nut not shown at its other end in the side wall portion 12C and is connected to the output terminal. It should be noted that "an electric cable connected to a vehicle electric motor" not shown can be connected to the output terminals in the side wall portions 12C and 12D.

The second member 40 (an input bus bar part) includes a resin member 41, a P bus bar 42, a N bus bar 43 and an aluminum wire 44.

The resin member 41 is made of PPS (that is, a resin having the insulating and heat resistance properties) similar to that of the housing component 12. For convenience, the resin member 41 is also referred to—third resin member—. The P and N bus bars 42 and 43 are thin plates made of the copper (a metal having the electric conductivity). The resin member 41 covers the P and N bus bars 42 and 43 for ensuring the insulating properties of the P and N bus bars 42 and 43. The surface of the resin member 41 is processed similar to the surface of the resin member 32 such that an unevenness is formed on this surface by the blasting (or the process treatment such as the plasma etching (the surface process treatment)). In other words, a surface roughness of the surface of the resin member 41 is larger than that of the surface of the housing component 12 which is made of the same material as that of the resin member 41 (PPS), however, is not processed by any surface process treatment. However, the surface of the resin member 41 may not be processed by such a surface process treatment.

FIG. 3 is a top view (a planar view) of the present power module under the state that the shield plate 13 and the first members 30 are omitted. In FIG. 3, for convenience of the description, only "the parts configuring the radiation plate 11, the housing component 12 and the second member 40" are shown and no part other than these parts are not shown. As shown in FIG. 3, the shapes of the P and N bus bars 42 and 43 in the planar view are the same as each other and are generally rectangular. Therefore, the shape of the second member 40 in the planar view is rectangular (a band shape). The second member 40 (the P and N bus bars 42 and 43) is supported on the side wall portion 12A at its one end and is supported on the side wall portion 12B at its other end. In other words, the housing component 12 supports and secures the second member 40.

Further, as can be understood from FIG. 1, the second member 40 configures a bridge for connecting the side wall portions 12A and 12B to each other so as not to contact the other parts in the space of the housing 10.

As shown in FIG. 1, the P bus bar 42 is connected to the wiring part 22 via "the aluminum wire 44 not covered". For convenience, the aluminum wire 44 is also referred to as—second metal member—. Also, similar to the P bus bar 42, the N bus bar 43 is connected to the wiring part 22 by an aluminum wire not shown in a sectional view other than the sectional view shown in FIG. 1. The P and N bus bars 42 and 43 are parallel to each other and the resin member 41 are positioned between the P and N bus bars. The P and N bus bars 42 and 43 supply "the direct current from the vehicle battery not shown" to the power semiconductors 23 via the wiring parts 22.

Further, as can be understood from FIG. 1, the first member 30 is positioned over the second member 40, spacing away from the second member 40 by a predetermined distance. That is, the first and second members 30 and 40 are insulated by the resin members 32 and 41 and the space.

A gel 50 having the insulating property is filled in the interior of the housing 10 at a portion above the radiation plate 11. The gel 50 prevents a foreign substance from adhering to the power semiconductors 23. As shown by a chain line in FIG. 1, the height of the gel 50 from the radiation plate 11 is larger than the height of the semiconductor circuit part 20 from the radiation plate and is smaller than the height of a portion of the first member 30 secured to the housing component 12 (hereinafter, this portion will be referred to as secured portion). Thereby, the gel adheres to the secured portion and thus, the fastening force of a screw used for the securing is prevented from being decreased.

By the configuration described above, the present power module converts the direct current of the vehicle battery to "the three-phase alternating current power for driving the vehicle electric motor".

When molding the first member 30, an injection molding method called an insert molding method is used. The insert molding method is a method for molding a resin by injecting a melted resin into a mold under the state that an insert parts (in this embodiment, the bus bars 31) in the mold and thereafter, solidifying the resin. In this insert molding method, the resin molding is carried out under the state that positioning pins for "positioning the bus bars 31 relative to the mold" and/or pressing pins for preventing the bus bars 31 from moving during the injection of the resin or the like abut against the bus bars 31. As a result, portions of the surface of the bus bars 31 where "the positioning pins and/or the pressing pins" abut, are not covered by the resin and thus, a portion of each of the bus bars 31 exposes to the exterior after the molding (refer to H1, H2, H3, H4 and H5 in FIG. 1).

Figure 6:
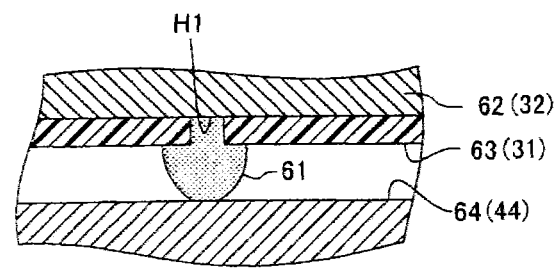
FIG. 6 shows a schematic diagram showing a state that the water droplet reaches the both of the metal member and the other metal member in the conventional electric component.

As a result, when the present power module is mounted on the vehicle under the state shown in FIG. 1, that is, under the state that the radiation plate 11 is at the vertically lower side and the shield plate 13 is at the vertically upper side, the aluminum wire 44 faces the exposing portion of the bus bar 31 at a position spaced vertically downward from and adjacent to the exposing portion H1. Similarly, the aluminum wire 44 faces the exposing portion of the bus bar 31 at a position spaced vertically downward from and adjacent to the exposing portion H3. On the other hand, the present power module is used, for example, under the high humidity environment and therefore, the water droplet occurring due to the dew condensation may exist in contact with the exposing portion H1 and/or H3. In this case, if no unevenness is formed on the surface of the resin member 31, the water droplet easily becomes large (the height of the water droplet increases). As a result, as shown in FIG. 6, the water droplet may reach the aluminum wire 44 and thus, the short may occur between the exposing portion H1 (the bus bar 31) and the aluminum wire 44. This problem occurs, resulting from the fact that the height of the water droplet produced by the dew condensation becomes larger than the distance between the exposing portion H1 and the aluminum wire 44.

On the other hand, the first member 30 of the present power module is processed to form the unevenness on the surface of the resin member 32. That is, the first member 30 is intentionally subject to the blasting after the molding of the first member such that the surface roughness of the surface of the resin member 32 becomes larger than that of the resin forming the housing component 12 (that is, the insulating member of the housing). In the common material, when the surface roughness of the surface increases, the surface area increases and thus, the contact angle of the water droplet relative to the surface decreases. Therefore, as shown in FIG. 4(B), the contact angle θ of the water droplet WD on the resin member 32 is a relatively small angle θ2 (which is smaller than the angle θ1, is smaller than or equal to 70 degrees, preferably, smaller than or equal to 60 degrees, further preferably, smaller than or equal to 50 degrees).

That is, the first member 30 is formed such that the contact angle θ2 of the water droplet relative to the surface of the resin member 32 is smaller than the contact angle θ1 (which is larger than 70 degrees and smaller than or equal to 90 degrees) of the water droplet relative to the surface of the resin forming the housing component 12. Thus, even when the water droplet exists on the surface of the resin member 32, the height of the water droplet decreases, compared with that before the surface of the resin member 32 is processed. Thereby, the possibility that the water droplet reaches the aluminum wire 44 from the first member 30, can be decreased and thus, the possibility that the short occurs between the both of them (the bus bar 31 and the aluminum wire 44), can be decreased.

Further, in order to decrease the contact angle of the water droplet relative to the surface of the resin, it is necessary to apply a separate process to the resin surface or change the resin material and thus, this may lead to the complication of the process and/or the increasing of the cost. On the other hand, according to this embodiment, the process for decreasing the contact angle of the water droplet is applied only to the exposing surfaces of the resin member 32 (the cover member) and the resin member 41 and the conventional method and the conventional material are used as the method and the resin for forming the housing component 12. Therefore, the complication of the process and/or the increasing of the cost can be avoided.

As described above, the power module according to the embodiment of the present invention is an electric component (the present power module) comprising:

a first member 30 which includes a first metal member (the bus bar 31) and a first cover member (the resin member 32) for covering the first metal member and is configured to have a predetermined area where only the first metal member and the cover member expose to the exterior (for example, the circle area having a predetermined radius about the exposing portion H1 or H3);

a housing 10 which supports the first member 30 and is configured such that a part of or an entirety of a surface thereof exposes to the exterior; and a second member 40 which includes a second metal member (the aluminum wire 44) and is configured to have an exposing portion where a surface of the second metal member exposes, and wherein a portion where the first metal member exposes to the exterior at the predetermined area (the exposing portions H1 and H3) and the exposing portion of the second metal member face each other and at least one of the first and second metal members is used as an electric conductor, and wherein the cover member is configured such that the contact angle of the water droplet relative to the surface within the predetermined area is smaller than or equal to 70 degrees.

Therefore, the possibility that the short occurs between the first and second metal members (31) and (44) when the dew condensation occurs, can be decreased.

The present invention is not limited to the aforementioned embodiment and various modification can be employed within the scope of the present invention.

For example, in the aforementioned embodiment, the blasting is applied to the surface of the first resin member 32 to decrease the contact angle of the water droplet relative to the surface, however, a surface process such as a UV ozone method (including a surface modification process and/or a surface washing process) can be applied to the surface of the first resin member 32 to decrease the contact angle of the water droplet. Further, a coating for decreasing the contact angle of the water droplet (a surface coating process) may be applied to the surface of the resin member 32 (and the resin member 41). Further, the coating may be made of a material other than the resin, for example, may be the silicon dioxide such as the silica. Further, the resin member 32 of the first member 30 (and the resin member 41 of the second member 40) may be formed of "a material having a high affinity for the water other than PPS". That is, the resin member 32 (and the resin member 41) can be made of the material having the insulating and heat resistance properties and the small contact angle of the water droplet relative to the surface of the resin member 32 (that is, the contact angle smaller than or equal to 70 degrees). Further, it is sufficient that the first member 30 has a predetermined area where only the first metal member 31 and the cover member (the resin member 32) expose to the exterior and the first member 30 may be configured using materials other than those of "the first metal member 31 and the cover member".

In the aforementioned embodiment, the object subject to "the selection of the process or the material for decreasing the contact angle of the water droplet (hereinafter, this selection will be also referred to as process/material selection)" in order to avoid the complication of the process and/or the increasing of the cost, is limited to the resin member 32 of the first member 30 (and the resin member 41 of the second member 40).

On the other hand, according to the other modification of the present invention, "the selection of the process or the material for increasing the contact angle of the water droplet" is applied only to the housing component 12 of the housing 10. Concretely, according to the other modification, the housing component 12 is made of "a material having a relatively small affinity for the water (a material having a relatively large contact angle of the water droplet)" such as the fluorine resin. This is because it is desired that the housing 10 is made of the material having a relatively small affinity for the water, since the water affects the electric component such as the power module. In this connection, in case that "the material having a relatively large contact angle of the water droplet" is used for the resin member forming the housing component 12, if the same material is used for the resin member 32 of the first member 30 (and the resin member 41 of the second member 40), the contact angle of the water droplet relative to the surface of the resin member 32 becomes larger than that of the surface of the conventional member. In this case, when the water droplet exists between the exposing metal members, the possibility that the short occurs between the metal members, increases. According to the modification, the resin member 32 of the first member 30 (and the resin member 41 of the second member 40) is made of the material having the contact angle of the water smaller than that relative to the housing component 12. According to this modification, the increasing of the contact angle of the water droplet relative to the surface of the resin member 32 of the first member 30, compared with that of the conventional case, can be avoided and thus, the increasing of the possibility that the short occurs between the metal members, can be avoided.

Further, only in order to accomplish the object to "decrease the possibility that the short occurs between the metal members due to the water droplet produced by the dew condensation", it is sufficient that at least the surface of the resin member 32 (the cover member positioned at the vertically upper location when the electric component is used) has the high affinity for the water and the contact angle of the water droplet relative to the surface is small. That is, it is sufficient that at least the process/material selection is applied to the cover member of the first member and it doesn't matter whether the process/material selection is applied to the other member or not. In other words, the contact angle of the water droplet relative to the surface of the housing component 12 is optional and thus, the process/material selection may be applied to the surface of the housing component 12 to decrease the contact angle of the water droplet and to the contrary, no process/material selection may be applied to the surface of the housing component 12.

Further, the planar shape of each of the exposing portions H1 to H5 of the first member are optional and thus, for example, may be circular or rectangular.

Further, the embodiment that the aluminum wire 44 exists adjacent to the exposing portions H1 and H1 of the first member 30, has been described, however, the present invention is not limited to this combination and thus, the present invention can be applied to the electric component having a combination of other members. That is, the present invention can be applied to the electric component comprising the first member having a predetermined area where only "the first metal member and the cover member" expose to the exterior and the second member (for example, the metallic radiation plate) having "an exposing portion where the surface of the second metal member exposes" facing the portion at the predetermined area where the first metal member exposes to the exterior. However, it is necessary that at least one of the first and second metal members is used as an electric conductor (a member through which the current flowing through the circuit of the electric component passes). That is, for example, the present invention can be applied to a case that the first metal member includes the bus bar used as the electric conductor and the second metal member includes "the shield plate, the radiation plate and the like" not used as the electric conductors. Further, it is not necessary that at least one of the process treatment, the surface modification treatment, the surface washing treatment, the surface coating treatment and the like for forming the unevenness is applied to the entire periphery of the cover member to decrease the contact angle of the water droplet and thus, the treatment may be applied only to the surface within a predetermined range surrounding the exposing portions H1 and H3 to decrease the contact angle of the water droplet. Further, the electric component is not limited to the power module and thus may be an electric component having the other function.

The invention claimed is:

1. An electric component comprising:
  a first member which includes a first metal member and a cover member for covering said first metal member and is configured to have a predetermined area where only said first metal member and said cover member expose to the exterior; and
  a second member which includes a second metal member and is configured to have an exposing portion where a surface of said second metal member exposes, and
  wherein a portion where said first metal member exposes to the exterior at said predetermined area and said exposing portion of said second metal member face each other and at least one of said first and second metal members is used as an electric conductor, and
  wherein said cover member is configured such that a contact angle of a water droplet relative to a surface within said predetermined area is smaller than or equal to 70 degrees.

2. The electric component as set forth in claim 1, wherein said cover member is processed to have a surface roughness such that the contact angle of the water droplet relative to said surface within said predetermined area is smaller than or equal to 70 degrees.

3. An electric component comprising:
  a first member which includes a first metal member and a cover member for covering said first metal member and is configured to have a predetermined area where only said first metal member and said cover member expose to the exterior; and
  a second member which includes a second metal member and is configured to have an exposing portion where a surface of said second metal member exposes, and
  wherein a portion where said first metal member exposes to the exterior at said predetermined area and said exposing portion of said second metal member face each other and at least one of said first and second metal members is used as an electric conductor, and
  wherein said cover member is processed to decrease a contact angle of a water droplet relative to a surface within said predetermined area.

4. An electric component comprising:
  a first member which includes a first metal member and a cover member for covering said first metal member and is configured to have a predetermined area where only said first metal member and said cover member expose to the exterior;
  a second member which includes a second metal member and is configured to have an exposing portion where a surface of said second metal member exposes; and
  a housing which supports said first member and includes an insulating member and is configured such that a part of or an entirety of a surface of said insulating member exposes to the exterior, and
  wherein a portion where said first metal member exposes to the exterior at said predetermined area and said exposing portion of said second metal member face each other and at least one of said first and second metal members is used as an electric conductor, and
  wherein said cover member is configured such that a contact angle of a water droplet relative to a surface within said predetermined area is smaller than that relative to said surface of said insulating member exposing to the exterior.

* * * * *